United States Patent [19]
Salut

[11] Patent Number: 5,933,352
[45] Date of Patent: Aug. 3, 1999

[54] METHOD AND A SYSTEM FOR NON-LINEAR OPTIMAL ESTIMATION OF DYNAMIC PROCESSES IN REAL TIME

[76] Inventor: Gérard Salut, 43, rue des Couteliers, 31000 Toulouse, France

[21] Appl. No.: 08/750,313

[22] PCT Filed: Jun. 6, 1996

[86] PCT No.: PCT/FR95/00730

§ 371 Date: Nov. 26, 1996

§ 102(e) Date: Nov. 26, 1996

[87] PCT Pub. No.: WO95/34028

PCT Pub. Date: Dec. 14, 1995

[30] Foreign Application Priority Data

Jun. 8, 1994 [FR] France .................................. 94/07274

[51] Int. Cl.$^6$ .......................... G05B 15/00; G05B 13/04; G06F 19/00
[52] U.S. Cl. ............... 364/474.16; 364/131; 364/474.01; 364/474.11; 364/151; 702/185
[58] Field of Search ..................... 364/148, 413, 364/724.01, 551.02, 151, 131, 474.01, 474.11, 474.16; 395/13, 23; 358/209; 702/185

[56] References Cited

U.S. PATENT DOCUMENTS

| | | | |
|---|---|---|---|
| 4,412,288 | 10/1983 | Herman | 364/413 |
| 4,625,242 | 11/1986 | Baumberg | 358/209 |
| 5,136,686 | 8/1992 | Koza | 395/13 |
| 5,148,513 | 9/1992 | Koza et al. | 395/13 |
| 5,402,333 | 3/1995 | Cardner | 364/151 |
| 5,408,424 | 4/1995 | Lo | 364/724.01 |
| 5,566,092 | 10/1996 | Wang et al. | 702/185 |
| 5,649,065 | 7/1997 | Lo et al. | 395/23 |

FOREIGN PATENT DOCUMENTS

A 0 516 895   12/1992   European Pat. Off. .

OTHER PUBLICATIONS

*International Search Report*, for PCT/FR95/00730.
*Detection of Small Leakages by a Combination of Dedicated Kalman Filters and an Extended Version of the Binary Sequential Probability Ratio Test*, Atilla Racz Kfki, Nuclear Technology, Oct. 93, vol. 04, No. 1 La Grange Park, Illinois, pp. 128–146.
*Estimation and Decision for Observations Derived from Martingales: Part II*, M.V. Vaca et al., IEEE Transactions on Information Theory, vol. 24, No. 1, Jan. 1978 New York pp. 32–45.

*Primary Examiner*—William Grant
*Assistant Examiner*—Carolyn T. Baumgardner
*Attorney, Agent, or Firm*—Wolf, Greenfield & Sacks, P.C.

[57] ABSTRACT

A system for non-linear optimal estimation of a state of a dynamic process in real time includes several measurement sensors for delivering sampled data associated with the state of the process at the instant under consideration t, and a computation unit associated with memories and loaded with computation programs suitable for delivering in recurrent manner the estimated components of the state of the process at the instant under consideration t. The computation unit includes N particular processors disposed in parallel and each receiving the measurement data. Each of the N processors includes at least one behavior random generator which, by taking account of random disturbances in said behavior, delivers possible values of the state of the dynamic process at the instant t, together with a specialized operator which uses possible values for the state of the process and the measurement data to compute a scalar magnitude representing the probability that the state is real at instant t of the process.

10 Claims, 3 Drawing Sheets

METHOD AND A SYSTEM FOR NON-LINEAR OPTIMAL ESTIMATION OF DYNAMIC PROCESSES IN REAL TIME

The present invention relates to a method and a system for non-linear optimal estimation of dynamic processes in real time.

BACKGROUND OF THE INVENTION

The method of the invention is based on replicating a large number of simulated random particles, and the system for implementing the method is such that it makes it possible by digital computation to restitute the estimated state of such processes on the basis of sampled measurement signals taken by a sensor suitable for receiving information characteristic of the state of said dynamic process.

The estimation is said to be "non-linear" since it cannot be reduced to linear operations, and it is said to be "optimal" since the process and the measurements are subject to disturbances or noise which make probabilistic optimization of said restitution necessary. Finally, by their very nature, the recurrent methods of the method and of the system make it possible for them to operate and to be applied in real time.

The technical field of the invention is the field of making measurement and computation systems for estimating in real time the current state of a dynamic process and for forecasting future states thereof, on the basis of successive imperfect observations of the process as provided by means of one or more sensors.

Applications of the invention include restitution, tracking, and forecasting, e.g. of the trajectory of an aircraft with the help of a radar, and also the state of a chemical reaction on the basis of fragmentary measurements of product concentrations, or they may include processing signals received from a positioning satellite to extract the position of the moving body receiving the satellite, etc. . . . . .

Figure 1:
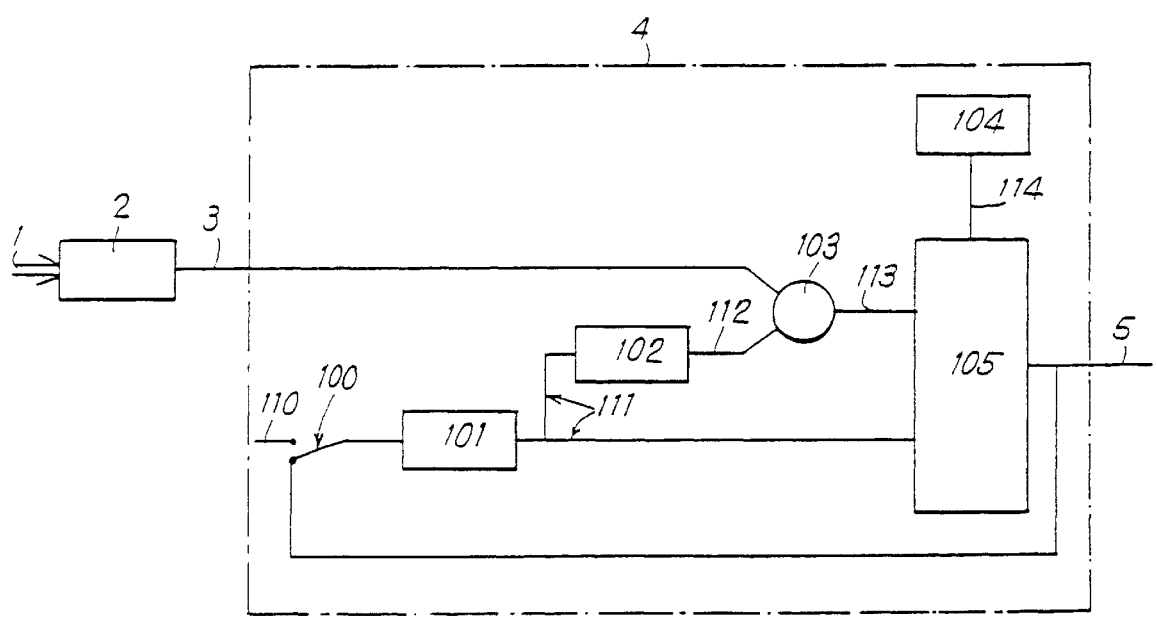
FIG. 1 is a diagram of a known method and system for Kalman linear estimation.

It is recalled that if the way in which a physical process varies over time is known, then it is possible to deduce what will be observed by the, or each, sensor associated with the process at any instant. Estimating the behavior of such a dynamic process in order to restitute and track the corresponding succession of different states consists in solving the inverse of the above problem: that constitutes the problem posed by the present invention which, itself provides the solution which is "best" in the probabilistic sense. Since the real behavior of the process is unknown, the idea is to make an estimate at each instant that corresponds best with the present and past observations made by the sensor(s). Such estimation consists in computing the values of a set of unknown variables also referred to as the "components" or the "state vectors" of said process, and in using them in the model of the behavior thereof. More precisely, the idea is to construct the probability distribution of said state, conditional on the set of measurements taken over time. Any prediction of future behavior is then the result of extrapolating said state vector, on the basis of said distribution, and depending on the model for the behavior of the dynamic process.

When it is desired actually to perform optimal estimation of a general dynamic process, the problem as described above does not have a solution that can be constructed on the basis of known digital methods or systems, because of the resulting dimensional and combinatory explosion.

A single exception to the above rule has been known for a long time. This is Kalman linear estimation which relies on linear models of the process described by:

a state transition matrix $\hat{O}(t,t-1)$; and a matrix H of measurements taken.

In that case, the simple algorithmic solution can be executed by a conventional computer machine. The method is well known and can be summarized as follows, with reference to the corresponding known device shown in FIG. 1:

in general, at an instant under consideration t, measurement sensors 2 acquire sampled measurement data 3 associated with the state of a process 1 that is to be estimated; the estimated components 5 for the state of the process 1 are then deduced from the measurements 3 in application of a method described below and performed by the computation unit 4;

at instant t=1, a switch 100 delivers the initial components 110 of the state of the process to the state predictor 101, which initial components are either estimated before performing any measurements, or are stored in a memory, or are taken from any other means, and they are represented by the vector E[x1/1]; at the following instants, t>1, said switch 100 switches to deliver to the state predictor 101 the components E[xt−1/t−1] of the state 5 as estimated by the corrector 105 at the preceding instant. On the basis of the components 5 of said estimated state, the state predictor 101 supplies the state vector 111 as predicted at instant t, written E[xt/t−1], by applying the state transition matrix $\hat{O}(t,t-1)$ to the estimated state, ignoring random control terms, and in application of the following formula:

$$E[xt/t-1]=O(t,t-1)E[xt-1/t-1]$$

on the basis of this predicted state 111, the measurement predictor 102 supplies a predicted measurement vector 112 at instant t, written E[yt/t−1], by applying the observation matrix H to said predicted state 111, ignoring random terms and using the relationship E[yt/t−1]=H(E[xt/t−1]). A subtracter 103 delivers the innovation 113, i.e. the difference between the real measurement vector 3 at instant t of the state of the process 1 as obtained from the sensors 2, written yt and the predicted measurement vector 112 for the same instant;

on the basis of the components of the predicted state 111 and of the innovation 113, the corrector 105 computes the new estimated state 5 E[xt/t] at instant t by adding the innovation 113 multiplied by a matrix gain 114 written Kt to the predicted state 111 in application of the formula:

$$E[xt/t]=E[xt/t-1]+Kt(yt-E[yt/t-1])$$

said matrix gain 114 is computed recursively by known means 104 adapted for that purpose and independently of any measurement, on the basis of the state transition matrix of the process $\hat{O}(t,t-1)$, of the observation matrix H, and of the second order characteristics of the random disturbances acting both on the dynamics of the process 1 and on the sensors 2 that pick up the measurement data 3; and the set of steps of the known Kalman method as shown in FIG. 1 is repeated after incrementing instant t by a new cycle of prediction, measurement, and correction.

However, Kalman linear estimation imposes restrictive conditions that are often absent in practice, such as, in particular, phenomena that are described by linear models and disturbances that are described by second order statistics. In spite of that, an extension of that estimator known as an extended Kalman estimator is commonly used in non-linear situations, even though it is pertinent only if the differences between the model of the real phenomenon and its description after the model has been linearized are small, and is never applicable to the general case including large amounts of non-linearity.

Various methods and systems for state restitution and prediction are known as applied to special situations, and some of them constitute the subject matter of patent applications such as French application 2 599 874 published on Dec. 11, 1987 in the name of GEC AVIONICS Limited, for "Apparatus for measuring the dynamic state of a system, in particular for an aircraft navigation system" which includes, in particular, a recurrence estimation circuit such as specifically a Kalman filter; or French application 2 692 037 published on Dec. 10, 1993 in the name of THOMSON CSF and entitled "A method of diagnosing a varying process" based on a reference state and a present state, using physical magnitudes as measured and compared, and relying on fuzzy logic to classify the measurements in order to perform diagnosis with the help of expert rules.

For the first of those two methods, the limitations associated with using a Kalman filter have already been mentioned above, and as for the second, it relates to qualitative diagnosis of a kind that is not concerned with the probabilistic requirements constituting the subject matter of the present invention.

Closer to the present invention, mention may be made of French application 2 688 909 published on Sep. 24, 1993 in the name of THOMSON CSF and entitled "A method of plotting the trajectory of a moving body in a noisy environment" which consists in subdividing the state space in which the moving bodies can be situated and in giving the subdivisions weights determined on the basis of measurements taken by sensors in order to determine the most probable paths using modellization by means of hidden Markov chains and by constructing paths using the Viterbi algorithm.

In that method, the main objection that limits its scope is the a priori nature of the way in which state space is subdivided. No account is taken either of the dynamic flow of the physical laws concerning the phenomenon, nor of the measurements taken which may have an influence on the subdivision. This gives rise to a dimensional and combinatory explosion that severely reduces the applicability and the accuracy that are possible with that method.

OBJECTS AND SUMMARY OF THE INVENTION

The method of the present invention applies to situations that are more general and where the above-described solutions are inapplicable. The method requires an architecture and a basic principle that are quite different and it relies on massive replication of unit non-linear processors organized in a parallel array, in a specific arrangement described below: the description relates to a method that can be called "particular" and to a system or arrangement for digital resolution thereof, enabling the method to be implemented and which includes, in particular, a recursive system accepting as an input the probabilistic model of state transitions in the process to be estimated, and delivering at its output the probabilistic weights of the state components of the process conditional on the measurements taken by the sensors, and doing so in real time.

Figure 2:
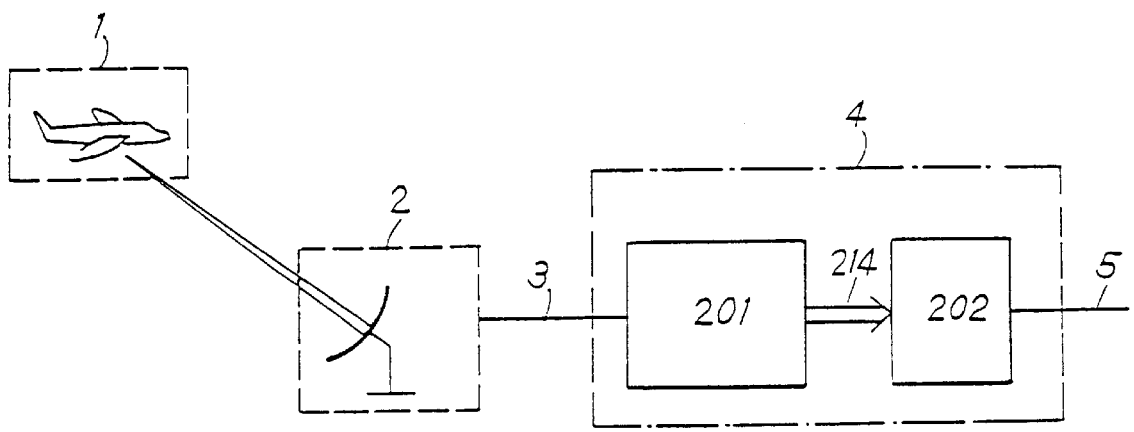
FIG. 2 shows an example of an electromechanical application for tracking and forecasting the trajectory of an aircraft.

To illustrate the description of the problem posed as outlined in the introduction, while simultaneously describing one of the applications of the present invention, FIG. 2 shows an example in the electromechanical field for tracking and forecasting the trajectory of an aircraft 1 on the basis of digital data 3 supplied by a sensor such as a tracking radar 2. The dynamic model of the aircraft 1 can be built up from the fundamental laws of aerodynamics. The components 5 of the state that is to be estimated comprise, in particular: the geographical position of its center of gravity, its velocity, and the values of commands associated with pilot actions such as the angles of control surfaces, propulsion force, etc. At each instant t the sensor 2 supplies measurements 3 such as range, azimuth, and elevation constituting fragments of the state vector x in application of a known probability law: it must then be possible to reconstitute the probability 214 of components in the state x of the aircraft 1 conditionally on all of the accumulated observations 3 by means of a computation unit 4 comprising processors 201 applying the method described in the present invention; downstream from said processors 201, said computation unit may include a computation operator 202 which makes use of the probabilistic distribution 214 of the state of the aircraft 1 to deduce one or more specific items of information in that state, such as the components 5 mentioned above.

This is made all the more difficult to perform when the measurements and the behavior of the process 1, e.g. the aircraft, are generally subject to random disturbances acting amongst other things on the process itself, and not detectable from the ground, even by radar 2: this applies, for example, when the pilot acts suddenly on the controls, or when an atmospheric disturbances influences the path of the aircraft; also, noise can disturb radar measurement itself or it can disturb any other measurement sensor.

Figure 3:
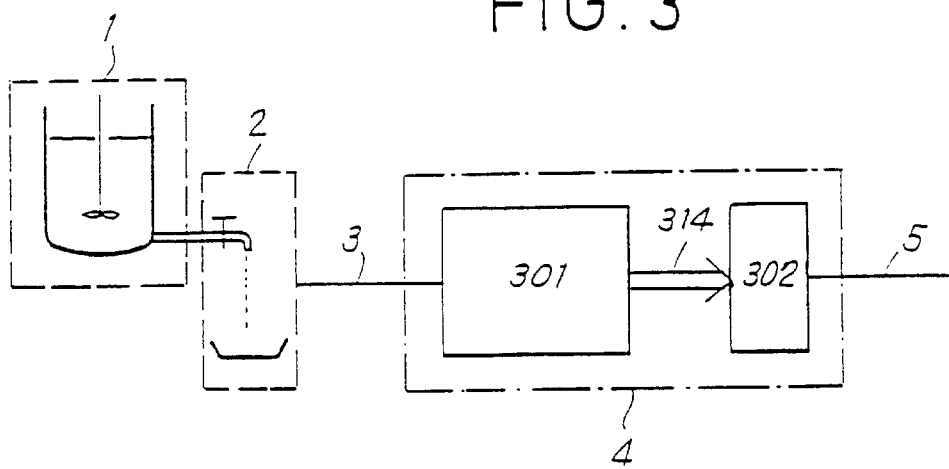
FIG. 3 shows an example of an application in the biochemical field for tracking and forecasting fermentation.

FIG. 3 is another example, in the biochemical field, concerned with tracking and forecasting the state of a fermentation process in a bioreactor 1 on the basis of sampled digital data 3 provided by a sensor 2, such as a concentration analyzer 2. The dynamic model of the fermentation process describes in non-linear manner the mass transfer phenomena that take place between the various components of the state 5 of the fermentation process that is to be estimated, such as the concentration of microorganisms characterizing the biomass, the concentration of nutrient feeding the biomass, and the concentration of the synthesized product that has been formed. At each instant t, after analyzing a sample that has been taken automatically the sensor 2 provides a fragmentary measurement 3, such as the concentration of nutrient. The probability 314 of the components of the fermentation state, which is conditional on all of the measurements 3 that have been accumulated over time, is computed by a computation unit 4 comprising processors 301 applying the method of the invention as described below; downstream from said processors 301, said computation unit 4 may also include a computation operator 302 which uses the probabilistic distribution 314 of the state of the bioreactor 1 to deduce one or more specific items of information in said state, such as the above-mentioned components.

According to the present invention, the dynamic process to be estimated relies on a probabilistic model of the type $x_{t+1}=f(x_t, w_t)$, also represented by its dynamic probability of state transition, written $p(x_{t+1}/x_t)$; the basic sampling instant of the process is written t; the vectors x and w represent respectively the components of the state of the dynamic process and the associated disturbance; finally, f designates the state transition function of the process 1.

The measurements performed rely on the probabilistic model yt=h(xt, vt) also represented by the probability of measurements from the state and written p(yt/xt); the vector y contains the measurements 3 taken by the sensors 2, the vector v contains disturbances which are usually additive, and that spoil the quality of the measurements 3; and finally h designates the fragmentary measurement function of the state of the process 1.

Figure 4:
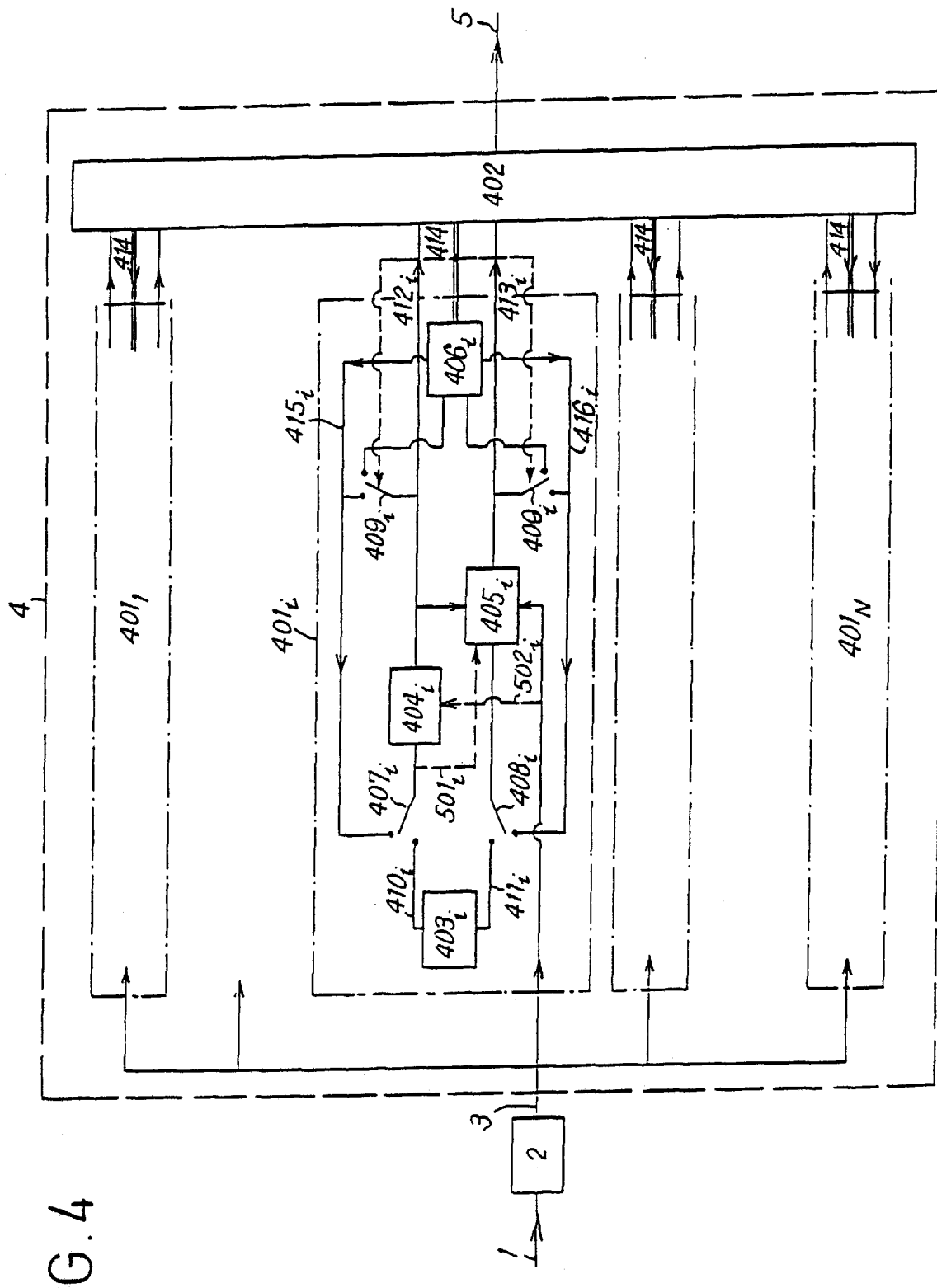
FIG. 4 is a diagrammatic view of the general structure both of the method (flow chart) and of the system of the invention.

The method of the invention for non-linear optimal estimation of dynamic processes in real time, and the system enabling it to be implemented by digital computer means, as shown in FIG. 4, then proceed as follows in a general contest that is known, such as:

sampled measurement data 3 associated with the state of the process 1 at the instant under consideration t is obtained by measurement sensors 2, such as a radar shown in FIG. 2;

estimated components 5 characterizing the state of the process at said instant t are then deduced on the basis of the data 3 measured by the sensors 2 and in application of a computation program stored in the computation unit 4; and the operation is repeated recurrently at the following state t+1 on the arrival of new measurements 3.

In addition, according to the invention:

use is made of N identical particular processors 401i disposed in parallel in said computation unit 4 and each comprising at least two associated elementary operators, one of which is a behavior random generator 404i which delivers components of a possible state 412i of the dynamic process at the current instant t, and the other of which is a weighting unit 405i from which said components 412i delivered by the random generator 404i are associated with a scalar magnitude 413i referred to as a weight, representing the probability that said components 412i are those of the current state of the dynamic process 1 to be estimated;

said behavior random generator 404i produces a possible state 412i for the process to be estimated selected from the set constituting state space, and taking into account the components of said possible state computed at instant t−1 and the probability of transition in the state of the dynamic process between instants t−1 and t;

said weighting unit 405i computes the weight 413i of possible state 412i on the basis of the value of said weight at the preceding instant t−1, on the basis of the values of the components of said possible state 412i, and on the basis of measurement data 3 picked up by the sensors 2 at the current instant t, with all the above taking into account the probability of noise disturbing said measurements;

each processor 401i is initialized by randomly drawing the initial components 410i of said possible state and the associated initial weight 411i by means of an initial state generator 403i which applies its own specific a priori probability relationship representative of knowledge about the initial state of the dynamic process 1; and at each instant t, the probabilistic distribution of the state of the dynamic process conditional on the data 3 measured by the sensors 2 up to the instant t is delivered at each said instant t, said distribution having as its support the set of possible states 412i and as its mass point distribution the weights 413i associated with each of said possible states.

To perform the above method, the system of the invention for non-linear optimal estimation of the state of a dynamic process 1 in real time includes measurement sensors 2 delivering sampled data 3 associated with the state of the process 1 at the instant under consideration t, and a computation unit 4 comprising N particular processors 401i disposed in parallel and each receiving said measurement data 3; each of said N processors 401i includes at least one behavior random generator 404i which, taking account of random disturbances in said behavior, delivers possible values 412i of the state of the dynamic process 1 at the instant t, together with a specialized operator 405i which uses said possible values 412i for the state of the process and said measurement data 3 to compute a scalar magnitude 413i representing the probability that said state 412i is real at instant t of the process.

DETAILED DESCRIPTION

The said computation unit 4 is loaded with programs suitable for enabling said system to operate in application of the method as described above and below, both in its main minimum implementation and in its preferred implementations.

Each unit or particular processor such as 401i thus receives the measurement vector 3 taken at instant t by the sensors 2 and it simulates a possible particular trajectory, i.e. the behavior of a random particle whose state satisfies the same probabilistic model as the process 1 to be estimated.

Thus, each of said particular processors 401i implements a computation program that has previously been applied thereto and stored in an associated memory; for example, and supplies two items of output information: a vector magnitude 412i written $x^i t$ representing the components of a possible state of the state vector x of the process 1 to be estimated at the current instant t; and a scalar magnitude 413i called a "weight" and written $p^i t$, representing the probability that the vector $x^i t$ is the vector of the process to be estimated, given the measurements 3 available up to instant t.

The two degrees of freedom constituted by the vector magnitude 412i and the scalar magnitude 413i as computed by each of the N processors are used to construct the probability of the state conditional on the observations, written p(xt/yÒ for $0\mu$ Ò$\mu$ t) in the "weak" mathematical sense. Said probabilistic distribution or law has as its support the set of possible states 412i, and as its mass point distribution the weights 413i, $p^i t$ associated with said states.

There follows a detailed description of one particular processor 401i:

at the initial instant written t=1, the switch 407i delivers to the behavior generator 404i the components 410i of the possible initial state, drawn randomly by the initial state generator 403i in application of a specific a priori probability relationship, said relationship being representative of knowledge about the initial state of the process to be estimated. The switch 408i delivers to the weighting unit 405i the non-normalized probability or weight 411i associated with drawing the components of the possible initial state 410i;

at the following instants t, the switch 407i delivers to the behavior generator 404i the components $x^i t-1$ of the possible state 412i computed by the same generator at instant t−1; the switch 408i delivers the weight 413i or $p^i t-1$ as computed at instant t−1 by the weighting unit to the input of the weighting unit 405i. The behavior generator 404i then computes the new components $x^i t$ of a possible state 412i at instant t, in application of the state transitions between instants t−1 and t, with the random terms written $w^i t$ being drawn as a function of their a priori probability, i.e.:

$$xit = f(xit-1, wit)$$

It should be emphasized that, if the nature of the process so requires, the state transitions between t−1 and t, the sampling instant of the measurements 3, can be constructed in the same manner as above, by means of finer transitions between subsampling instants tk, in particular for continuous processes.

On the basis of the components of the possible state 412i and of the real measurement vector 3 at instant t, the weighting unit 405i delivers the weights $p^i t$ of the state 412i, $x^i t$, which, in application of Bayes' theorem are equal to the product of the probability of measurement noise explaining yt on the basis of $s^i t$ multiplied by the weight associated with the components of the possible state $x^i$ at instant t−1, i.e.:

$$pit = p(yt/xit) pit-1$$

It can be guaranteed that for a sufficiently large number N of particular processors 401i, that the set 414 of N possible state vectors such as 412i, weighted by their respective weights 413i, is representative of the conditional probability relationship of the state vector of the process, since the law of large numbers ensures that the representation converges.

If the form of said relationship is not of interest, but only a better estimate of the state vector in application of some given criterion, then the array of N processors 401i of the minimal structure described above, is followed by a computation operator 402 specific to the corresponding estimator, such as the mean vector for the estimation that has minimum variance in estimation error, or the vector having maximum likelihood. The optimum estimated state 5 of the dynamic process 1 is determined on the basis of said conditional probabilistic distribution by selecting a particular indicator enabling the above estimation to be performed by the computation operator 402.

By way of example, computing the estimated mean state vector 5, xt, reduces to:

$$E[xt] = \sum_{i=1}^{N} xit(pit / \sum_{j=1}^{N} pjt)$$

In a preferred mode of operation, in which the system is to operate continuously, it is necessary to adapt it and its method since the weights 413 coming from direct application of the weighting unit 405 can degenerate over time, under the effect of indefinite accumulation of measurements 3. In order to guarantee uniform performance over time for a given number N of processors 401i, it is then necessary to regularize the probability weights 413i by limiting the effects thereof over time. For this purpose, two variants may be applied:

by forgetting old information asymptotically, e.g. by sliding exponential forgetting; or by taking account only of a finite portion of the observations, e.g. by using a sliding time window.

The influence of past data as measured by the sensors 2 on the weight 413i associated with the components 412i of a possible state is thus either strictly limited in time or else is attenuated asymptotically.

In a preferred implementation in which the dynamic process to be estimated is unstable, the random disturbances drawn in application of an a priori behavior relationship lead to behavior of the possible states 412i that is naturally divergent and thus to progressive degeneration of the weights 413i. Under such circumstances, the random behavior generator 404i is conditioned in such a manner as to restore convergence by drawing disturbances conditionally on the "n" measurements taken most recently by the sensors, "n" being the number of "unstable" modes of the model of the process 1. Operation of the method is then modified at instants t>1 by optional connections 501i and 502i as described below:

the weighting unit 405i delivers the weight 413i of the possible state $x^i$ at instant t on the basis of the probability of measurement noise explaining the measurements yt starting from the possible state at instant t−1, i.e.:

$$pit = p(yt/xit-1) pit-1$$

the behavior generator 404i then delivers a new possible state 412i at instant t in application of the behavior equation, drawing random terms $w^i t$ conditioned by the measurements 3 and using the value of the components of the possible state at instant t−1, i.e.:

$$xit = f(xit-1, wit)$$

$w^i t$ being drawn in application of the relationship $p(wt/x^i t-1, yt)$.

In a preferred embodiment, serving to improve the speed at which the estimation converges without increasing the number N of particular processors in the array, use is made of a procedure for redistributing the components of possible states 412i depending on their probability or likelihood: such a procedure as defined below concentrates the exploratory capacity of the array in those zones of state space where the probability of presence is at a maximum, thereby increasing the accuracy of the estimation. This variant introduces momentary coupling 414 between the end processor 401i of the computation unit 4 of the apparatus shown in FIG. 4. By means of switches 409i and a redistribution member 406i, both of which are then activated, the components of the N states 412i as delivered by the set of N particular processors 401i are randomly redistributed amongst at least some of the particular processors 401i in application of the conditional probabilistic distribution 414 reconstructed by the method of the present invention and in application of a specific procedure for activating the switches 409i. The restitution procedure is described below:

the weights 416i of the components of said redistributed states 415i are uniformly distributed over all of their supports 415i;

the switch 409i can activate the redistribution member 406i either periodically at a recurrence rate that is fixed a priori, or else by a computation program that is a function of the dispersion observed between the values 413i and the weights delivered at the present instant by the N processors;

said redistribution may be total covering all of the N particular processors 401i or it may be merely partial covering only a fraction thereof; newly-created possible states around the measurements 3 as delivered by the sensors may also be used as supports in the redistribution member 406i; and the state components 415i as redistributed in this way and their associated probability weights 416i are normally reused by said behavior generators 404i and said weighting units 405i at the following instant.

Said computation unit 4 may include a particular indicator 402 which receives the set 414 of said possible states 412i weighted by their weights 413i, and delivering the estimate 5 of the real state of the process 1 in accordance with its probable behavior.

The result is a new digital method and system for optimal estimation in real time of the state of a dynamic process, and which satisfies the above-specified objects, for any stochastic dynamic process of non-linear behavior which is tracked by sensors delivering noisy signals relating to a portion only of the state of the process.

The explanations given above concerning accompanying FIGS. 2 and 3 relate to particular implementations of the invention, in particular to its application to the trajectory of an aircraft, and they are not limiting in any way: other applications are possible, in particular any dynamic process as defined in the introduction.

In general, the method and the system of the invention, which can be described as being digital and particular for optimal non-linear estimation in real time of the state of a dynamic process, are based on the dynamic use of massive suitably-weighted random drams which reconstitute the probability of the state of the process to be estimated conditionally on observations delivered by the measurement sensor(s) for measuring certain components of the state of the process. Since they do not require equations of the problem to be solved explicitly, the method and the systems enabling it to be implementing on a practical basis are applicable regardless of the complexity of the models, particularly with respect to non-linearity and to non-Gaussian distribution. As a result no physical model, however realistic it may be, is impossible for the invention. In particular, the method uses the law of large numbers for exploring in compliance with a priori probabilities and the law of conditional probabilities for a posteriori correction by means of observations.

I claim:

1. A method for non-linear optimal estimation of dynamic processes in real time, the method comprising providing measurement sensors arranged to measure sampled data associated with a state of a dynamic process at an instant under consideration t; providing a computation unit associated with memories; said data measured by the sensors is then used in application of a computation program stored in the computation unit to deduce the estimated components of the state of the dynamic process at said instant t, and the operation is repeated recurrently to estimate the state at the instant following t+1 on arrival of new measurements;

using N identical particular processors disposed in parallel in said computation unit and each comprising at least two associated elementary operators, one of which is a behavior random generator which delivers components of a possible state of the dynamic process at the current instant t, and the other of which is a weighting unit from which said components delivered by the random generator are associated with a scalar magnitude referred to as a weight, representing the probability that said components are those of the current state of the dynamic process to be estimated;

producing by said behavior random generator a possible state for the process to be estimated selected from the set constituting state space, and taking into account the components of said possible state computed at instant t−1 and the probability of transition in the state of the dynamic process between instants t−1 and t;

computing by said weighting unit the weight of the possible state on the basis of the value of said weight at the preceding instant t−1, on the basis of the values of the components of said possible state, and on the basis of measurement data picked up by the sensors at the current instant t, with all the above taking into account the probability of noise disturbing said measurements;

initializing each processor by randomly drawing the initial components of said possible state and the associated initial weight by means of an initial state generator which applies its own specific a priori probability relationship representative of knowledge about the initial state of the dynamic process; and delivering, at each instant t, a probabilistic distribution of the state of the dynamic process conditional on the data measured by the sensors up to the instant t, said distribution having as its support the set of possible states and as its mass point distribution the weights associated with each of said possible states.

2. A method according to claim 1, wherein an optimal estimated state of the dynamic process is determined on the basis of said conditional probabilistic distribution by selecting a particular indicator.

3. A method according to claim 1, wherein the influence of past data measured by the sensors on the weights associated with the components of a possible state is strictly attenuated in time.

4. A method according to claim 1, wherein said behavior random generator is conditioned by the n most recent measurements taken by the sensors.

5. A method according to claim 1, wherein at least a portion of the N possible states depending on said conditional probabilistic distribution of the supports of said possible states delivered by the N particular processors are randomly redistributed by distribution members in uniformly weighted manner.

6. A system for non-linear optimal estimation of a state of a dynamic process in real time, the system comprising measurement sensors constructed to deliver sampled data associated with a state of a dynamic process at an instant under consideration t, a computation unit associated with memories and loaded with computation programs suitable for delivering in recurrent manner estimated components of the state of the dynamic process at the instant under consideration t, said computation unit comprising N particular processors disposed in parallel and each receiving said measurement data, each of said N processors including at least one behavior random generator which, by taking account of random disturbances in said behavior, delivers possible values of the state of the dynamic process at the instant t, and each of said N processors also including a weighting unit that uses said possible values for the state of the dynamic process and said measurement data to compute a scalar magnitude representing the probability that said state is real at the instant t of the process.

7. A system according to claim 6, wherein said computation unit includes a particular indicator which receives the set of said possible states weighted by their weights and delivering the estimate of the real state of the process depending on its probable behavior.

8. A system according to claim 6, wherein said computation unit is further arranged to be loaded with different programs.

9. A method according to claim 1, wherein the influence of past data measured by the sensors on the weights associated with the components of a possible state is attenuated asymptotically.

10. A system for non-linear optimal estimation of a state of a dynamic process in real time, the system comprising at least one measurement sensor for delivering sampled data associated with a state of a dynamic process at an instant under consideration t, a computation unit means loaded with computation programs for delivering in recurrent manner estimated components of the state of the dynamic process at the instant under consideration t, said computation unit means comprising N parallel processor means arranged to receive said measurement data, each said processor means including behavior random generator means for delivering possible values of the state of the dynamic process at the instant t by taking account of random disturbances in said behavior, and specialized operator means for computing a scalar magnitude, representing the probability that said state is real at the instant t of the process, by using the possible values for the state of the dynamic process and the measurement data.

* * * * *